June 30, 1964 J. J. TIEMANN 3,139,583

NEGATIVE RESISTANCE SEMICONDUCTOR MIXER WITH ONLY TWO RESONANT BRANCHES

Filed Dec. 24, 1959

Inventor:
Jerome J. Tiemann,
by John F. Ahern
His Attorney.

3,139,583

NEGATIVE RESISTANCE SEMICONDUCTOR MIXER WITH ONLY TWO RESONANT BRANCHES

Jerome J. Tiemann, Burnt Hills, N.Y., assignor to General Electric Company, a corporation of New York Filed Dec. 24, 1959, Ser. No. 861,884
2 Claims. (Cl. 325—449)

This invention relates to radio-frequency amplifier and converter circuits and in particular to such circuits using semiconductor devices.

With the advent of the transistor which provided an active element of long life, extremely small size and low power requirements, it has been possible to devise many electric circuits with a high degree of miniaturization.

Potentially one of the simplest amplifier circuits is the regenerative amplifier. These amplifiers, however, require an extremely high degree of stability. Because of this stability problem, regenerative amplifiers using known active elements, such as vacuum tubes and transistors have been limited to relatively low gain and have required involved and complex circuitry. Such amplifiers, therefore, have not been entirely satisfactory especially in cases where a high degree of miniaturization is desired.

This invention relates to a new and novel regenerative amplifier and converter using a single semiconductor device as the active element.

The semiconductor device used in the practice of this invention is a narrow junction degenerate semiconductor diode. By a "degenerate semiconductor" is meant a body of N-type semiconductor to which has been added a sufficient concentration of excess donor impurity to raise the Fermi-level to a higher energy than the conduction band edge; or to a P-type body to which has been added a sufficient concentration of excess acceptor impurity to depress the Fermi-level to a lower energy than the valence band edge.

When a device is formed having such degenerate semiconductor on both sides of a P-N type junction, respectively, the device exhibits a region of strong negative resistance at the low forward voltage range of its current-voltage characteristic. This negative resistance region is in the forward voltage range of less than 1 volt. Such a device is referred to herein as a narrow junction semiconductor device.

For further details concerning the semiconductor type devices used in the practice of this invention, reference may be had to my copending application, Serial No. 858,995, filed December 11, 1959, now abandoned, and assigned to the assignee of the present invention. The aforementioned application has been abandoned in favor of a continuation-in-part application, Serial No. 74,815, filed September 9, 1960, which discloses and claims the subject matter of the parent application.

It has been found that with appropriate co-operating circuitry the above described semiconductor device can be made to perform wave generating and amplifying function simultaneously.

It is an object of this invention, therefore, to provide a circuit which is not complex and which performs oscillatory and amplifying functions, as well as frequency conversion, using a simple narrow junction degenerate semiconductor diode as the only active circuit element thereof.

It is still another object of this invention to provide a radio-frequency amplifier, local oscillator, mixer and an intermediate frequency amplifier using a single narrow junction semiconductor diode and two resonant circuits.

Briefly stated, in accord with one aspect of this invention, the radio-frequency amplifier and converter comprises a narrow junction degenerate semiconductor diode and a frequency responsive network in circuit therewith. Means are provided to bias the diode for operation in the negative resistance region of its current-voltage characteristic. The frequency responsive network includes a first circuit branch which is resonant to the frequency of oscillations produced by the diode while functioning as a local oscillator. The frequency responsive network further includes a second circuit branch which is resonant to an intermediate frequency and which is the only other resonant circuit required. This intermediate frequency is usually the difference between the incoming signal frequency and the local oscillator frequency.

Signal power impressed on the first resonant circuit is regeneratively amplified by the narrow junction diode and mixed with the local oscillations which are simultaneously produced thereby. The resulting current oscillations at the intermediate frequency are further regeneratively amplified, thus producing an output at the intermediate frequency which depends upon the amplitude of the signal.

My invention will be better understood by reference to the following description taken in connection with the accompanying drawings in which—

Figure 1:
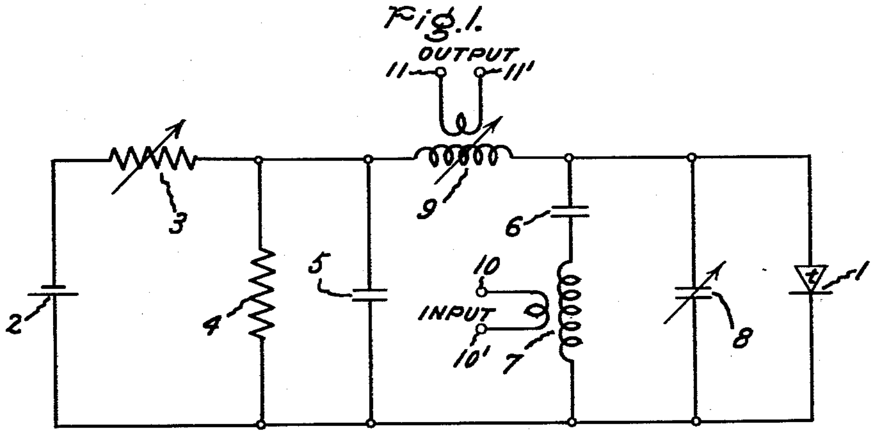
FIG. 1 is a schematic illustration of one embodiment of this invention.

The circuit of FIG. 1 utilizes the non-linear negative resistance characteristic of diode 1 in a regenerative radio-frequency amplifier and converter.

Diode 1 is connected to voltage source 2 through series-parallel resistors 3 and 4 and inductance 9. By-pass capacitor 5 is connected across resistor 4. The series combination of capacitance 6 and inductance 7 is connected in parallel with capacitance 8 and with diode 1. Inductance 9 is connected between capacitors 5 and 6. The combination of inductance 7 and capacitance 8 forms a first resonant circuit and the combination of capacitance 6 and inductance 9 forms a second resonant circuit.

Inductance 9 is selected to have a value much larger than that of inductance 7 and capacitance 6 is selected to have a value much larger than that of capacitance 8. By-pass capacitor 5 is much larger than capacitor 6 but not so large that the circuit produces oscillations within the selected intermediate ferquency band. To assure that diode 1 will not switch reisstance 4 is selected to have a value less than the absolute value of its negative resistance.

While this invention is subject to a wide range of applications, it is especially suited for use as a radio-frequency amplifier and converter and will be particularly described in connection therewith.

The operation of the circuit of FIG. 1 may best be described by reference to FIG. 2 which illustrates a typical current-voltage characteristic of a degenerate semiconductor device suitable for use in the practice of this invention.

Diode 1 is biased for operation in the negative resistance region such as shown by the direct current load line A. This may be, for example, by means of voltage source 2 and resistors 3 and 4, which provide a suitable low forward voltage to diode 1. A suitable voltage for a particular diode, for example, is 0.15 volt. While the negative resistance region of narrow junction degenerate semiconductor diode devices, suitable for use in the practice of this invention is usually in the forward voltage range of less than 1 volt, the range varies depending upon the semiconductor used. For example, for a germanium device the range is from about .04 to 0.3 volt; for silicon the range is about .08 to 0.4 volt and for gallium antimonide the range is about .03 to 0.3 volt.

The first circuit branch, including inductance 7 and capacitance 8, is tuned to be resonant at a selected first frequency. The impedance of this circuit branch across diode 1 results in oscillations being produced thereby having that frequency. This, therefore, is the frequency of the local oscillator portion of the circuit.

The local oscillator frequency is selected to be close to the frequency of the incoming signal but differs from it by the amount of the intermediate frequency. For example, in the conventional superheterodyne type of radio receiver, where the intermediate frequency is 450 kilocycles, the local oscillator has a frequency 450 kilocycles higher or lower than the incoming carrier.

The impedance of the first circuit branch is highest at the resonant frequency and will, therefore, be less at the signal frequency. The impedance of the first circuit branch, including inductance 7 and capacitance 8, establishes an effective load line at the signal frequency, such as shown at B, and another effective load line at the local oscillator frequency, such as shown at C.

The second circuit branch including inductance 9 and capacitance 6 is tuned to be resonant at the intermediate frequency. Capacitor 6 serves simultaneously as a blocking capacitor at one frequency and as a tuning element at another frequency. In addition, inductance 9 serves simultaneously as a radio-frequency choke at the one frequency and as a tuning element at the other frequency. In addition, the circuit may be tuned by adjustment of the bias on the diode which changes the position of the operating point O in the negative resistance region and the gain of the circuit may also be varied by such bias adjustment.

The impedance of the second resonant circuit at the intermediate frequency, is chosen such that the effective load line established thereby is steeper than the load line established at the signal frequency. The load line at the intermediate frequency is such as shown at D. This can be assured, for example, by an appropriate selection of components such that the "Q" of the circuit at the local oscillator frequency is higher than it is at the intermediate frequency.

Since the negative resistance of the narrow junction semiconductor diode utilized in the practice of this invention is independent of frequency it is possible to use an oscillator simultaneously as an amplifier at a different frequency.

Figure 2:
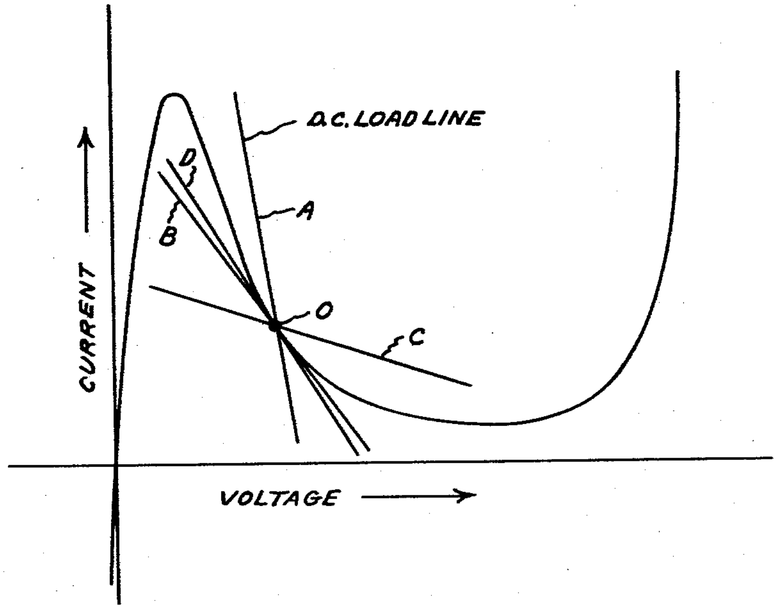
FIG. 2 is a typical current-voltage characteristic of a degenerate semiconductor diode device suitable for use in the practice of this invention.

As illustrated in FIG. 2 the load line at the signal frequency and the intermediate frequency are both of slightly greater slope than the diode characteristic at the operating point. This assures that, at these frequencies, the diode amplifies rather than oscillates. The load line at the local oscillator frequency, however, as shown at C has less slope than the diode characteristic, and thus causes the diode to produce oscillations at this frequency.

The local oscillations cause the operating point O to move back and forth along the characteristic into a region of the characteristic which is extremely non-linear. It has been found that the non-linear characteristic of the diode produces heterodyne frequencies corresponding to the sum and difference of the signal and the local oscillator. This non-linearity is much greater in the narrow junction diode utilized in the practice of this invention than in other known devices, for example, and thus produces very efficient mixing.

One circuit constructed in accord with the present invention utilized the following circuit parameters, which are given by way of example only:

| | | |
|---|---|---|
| Voltage source **2** | volts | 1.5 |
| Resistance **3** | ohms | 2500 |
| Resistance **4** | do | 100 |
| Capacitor **5** | microfarads | 0.02 |
| Capacitor **6** | do | 0.007 |
| Inductance **7** | microhenries | 0.2 |
| Capacitor **8** | micromicrofarads | 5 to 30 |
| Inductance **9** | microhenries | 2 to 5 |

Diode 1 has a value of peak current of 0.5 ma. and therefore an absolute value of negative resistance of 200 ohms.

This circuit when supplied with an A.C. signal of 88–108 mc. applied between terminals 10–10' produced an output signal at terminals 11–11' at a frequency of 1 mc. with an overall conversion gain of 30 db.

While only certain preferred features of the invention have been shown by way of illustration, many modifications and changes will occur to those skilled in the art and it is, therefore, to be understood that the appended claims are intended to cover all such modifications and changes as fall within the true spirit and scope of the invention.

What I claim as new and desire to secure by Leters Patent of the United States is:

1. A circuit comprising: a narrow junction degenerate semiconductor diode exhibiting a negative resistance region in the low forward voltage range of its current-voltage characteristic; means in circuit therewith biasing said diode to an operating point in said negative resistance region; a single frequency responsive network connected across said diode and consisting of a first circuit branch resonant to a first frequency and a second circuit branch resonant to a second frequency; means for impressing a selected signal on the first resonant circuit branch of said frequency responsive network, said network being adapted to provide load lines having slightly greater slopes than the slope of said characteristic at said operating point for said second frequency and the frequency of said selected signal and said network being adapted to provide a load line for said first frequency having a lesser slope than the slope of said characteristic at said operating point, to cause said diode to produce oscillations at said first frequency, amplification of the signal impressed on said first resonant circuit branch, mixing of said oscillations and said signal to produce said second frequency and amplification at said second frequency; and means for taking an output at said second frequency from said second resonant circuit branch.

2. A regenerative radio-frequency amplifier and converter circuit comprising: a narrow junction degenerate semiconductor diode exhibiting a negative resistance region in the low forward voltage range of its current-voltage characteristic; means for biasing said diode in said negative resistance region; a first capacitance connected across said diode; a series combination of a first inductance and second capacitance connected in parallel circuit with said first capacitance, said first capacitance and first inductance forming a first parallel resonant circuit branch, the magnitude of capacitance of said first capacitance being much larger than that of said second capacitance; means for impressing a signal on said first resonant circuit, said signal having a frequency near the parallel resonant frequency of said first resonant circuit; a second inductance in series circuit with said diode and said bias means and forming with said second capacitance a second parallel resonant circuit branch the parallel resonant frequency of which is the intermediate frequency produced by heterodyne action between oscillations produced by said diode at the parallel resonant frequency of said first resonant circuit branch and said impressed signal, the magnitude of inductance of said second inductance being much larger than that of said first inductance; means for taking an output from said second parallel resonant cricuit at said intermediate frequency, said output having a greater energy content than that of said signal; and means for by-passing alternating currents around said bias means.

References Cited in the file of this patent

UNITED STATES PATENTS

| | | |
|---|---|---|
| 2,772,360 | Shockley | Nov. 27, 1956 |

FOREIGN PATENTS

| | | |
|---|---|---|
| 158,879 | Australia | Dec. 4, 1952 |

OTHER REFERENCES

Gabel: "The Crystal as a Generator and Amplifier," The Wireless World and Radio Review, pages 2–5, October 1, 1924, and pages 47–50, October 8, 1924.